United States Patent
Okuda (10) Patent No.: US 10,492,312 B2
(45) Date of Patent: Nov. 26, 2019

(54) CONTROL PANEL AND METHOD OF REPLACING CONTROL PANEL

(71) Applicant: MITSUBISHI ELECTRIC CORPORATION, Chiyoda-ku, Tokyo (JP)

(72) Inventor: Susumu Okuda, Tokyo (JP)

(73) Assignee: MITSUBISHI ELECTRIC CORPORATION, Chiyoda-Ku, Tokyo (JP)

( * ) Notice: Subject to any disclaimer, the term of this patent is extended or adjusted under 35 U.S.C. 154(b) by 278 days.

(21) Appl. No.: 15/552,112

(22) PCT Filed: Apr. 3, 2015

(86) PCT No.: PCT/JP2015/060561
§ 371 (c)(1),
(2) Date: Aug. 18, 2017

(87) PCT Pub. No.: WO2016/157514
PCT Pub. Date: Oct. 6, 2016

(65) Prior Publication Data
US 2018/0077807 A1     Mar. 15, 2018

(51) Int. Cl.
H05K 5/00     (2006.01)
H05K 7/14     (2006.01)
H05K 1/18     (2006.01)

(52) U.S. Cl.
CPC ......... H05K 5/0017 (2013.01); H05K 7/1427 (2013.01); H05K 7/1469 (2013.01);
(Continued)

(58) Field of Classification Search
CPC ..... H05K 5/0017; H05K 7/1427; H05K 1/181
(Continued)

(56) References Cited

U.S. PATENT DOCUMENTS 3,175,179 A     3/1965   Trump
6,587,056 B1 *  7/2003   Fraser ................... H03K 17/97
                                                200/11 R
(Continued)

FOREIGN PATENT DOCUMENTS

DE     102004010003 A1     9/2005
DE     102010048920 A1     8/2011
(Continued)

OTHER PUBLICATIONS

Notice of Grounds of Rejection dated Jan. 5, 2016 issued by the Japanese Patent Office in corresponding Japanese Patent Application No. 2015-541730 and English language translation (6 pages).
(Continued)

*Primary Examiner* — Alfonso Perez Borroto
(74) *Attorney, Agent, or Firm* — Buchanan Ingersoll & Rooney PC (57) ABSTRACT

A control panel includes: a cable formed by a plurality of signal lines connected to an input/output unit of the control apparatus; a terminal block to which a plurality of external wirings connecting to a control target device are electrically connected; and an I/F terminal block between the terminal block and the cable. The I/F terminal block includes: a plurality of first terminals provided on the terminal block side and each having a corresponding one of the plurality of external wirings electrically connected thereto; a plurality of second terminals provided on the control apparatus side and each electrically connected to a corresponding one of the plurality of signal lines; and a switching circuit to change a combination of one of the plurality of first terminals and one of the plurality of second terminals connected in a one-to-one relation.

4 Claims, 9 Drawing Sheets

(52) U.S. Cl.
CPC . *H05K 7/1481* (2013.01); *G05B 2219/23258* (2013.01); *H05K 1/181* (2013.01); *H05K 2201/1031* (2013.01); *H05K 2201/10053* (2013.01); *H05K 2201/10189* (2013.01)

(58) Field of Classification Search
USPC .......................................................... 307/112
See application file for complete search history.

(56) References Cited

U.S. PATENT DOCUMENTS

| | | | |
|---|---|---|---|
| 9,906,259 B2* | 2/2018 | Richardson | G06F 1/1626 |
| 10,154,559 B1* | 12/2018 | Yang | H05B 33/0854 |
| 2007/0184684 A1 | 8/2007 | Bormann et al. | |
| 2010/0182262 A1* | 7/2010 | Yoshikawa | G06F 1/1601 345/173 |

FOREIGN PATENT DOCUMENTS

| | | |
|---|---|---|
| JP | 60-106307 A | 6/1985 |
| JP | 3-155311 A | 7/1991 |
| JP | 2005-243001 A | 9/2005 |
| JP | 2006-234696 A | 9/2006 |
| JP | 2008-289280 A | 11/2008 |
| JP | 2010-205935 A | 9/2010 |
| WO | 2005/083535 A1 | 9/2005 |

OTHER PUBLICATIONS

International Search Report (PCT/ISA/210) dated Apr. 28, 2015, by the Japanese Patent Office as the International Searching Authority for International Application No. PCT/JP2015/060561.

Written Opinion (PCT/ISA/237) dated Apr. 28, 2015, by the Japanese Patent Office as the International Searching Authority for International Application No. PCT/JP2015/060561.

Extended European Search Report dated Oct. 26, 2018, issued by the European Patent Office in corresponding European Application No. 15887660.7. (9 pages).

\* cited by examiner

CONTROL PANEL AND METHOD OF REPLACING CONTROL PANEL

TECHNICAL FIELD

The present invention relates to a control panel for monitoring and controlling a plant, and particularly to a technique for increasing the efficiency of a task of replacing the control panel.

BACKGROUND ART

As to a control panel responsible for instrumentation and control of a plant, transition from a conventional analog-control-type control panel to a digital-control-type control panel has been recently progressing from the viewpoint of reliability and maintainability. Therefore, in an existing plant, a task of replacing an existing analog-control-type control panel with another digital-control-type control panel has been performed.

Generally, in the task of replacing an existing control panel with another control panel, a cable disposed between a control target device and the existing control panel is first removed from the control panel, with the operation of a plant stopped. Thereafter, when the control panel is removed and another control panel is placed, the removed cable is connected to this newly-provided control panel. Then, a trial run of the newly-provided control panel is conducted to perform wiring check and the like. If it is confirmed that there is nothing wrong, the replacement task is ended.

As described above, the task of replacing the control panel involves the stop of the operation of the plant, and thus, the replacement task is normally performed during a maintenance and inspection period of the plant. In order to increase an operation rate of the plant, completion of the replacement task within the maintenance and inspection period is necessary.

As a method of replacing a control panel, Japanese Patent Laying-Open No. 2008-289280 (PTD 1), for example, discloses a method of switching an existing wiring connected to a control apparatus of an existing control panel via a card-side terminal block to a control apparatus of a newly-provided control panel, thereby replacing the control panel. According to the replacement method described in PTD 1, a relay frame, which incorporates therein card-side terminal receptacles corresponding to the card-side terminal block and relay terminals connected to terminals of the card-side terminal receptacles, is mounted at a prescribed position of the existing control panel in operation. Next, during operation of the existing control panel, an extension cable is connected between the relay terminals in the relay frame and the control apparatus of the newly-provided control panel. Thereafter, the existing control panel is stopped, and then, the card-side terminal block is removed from the control apparatus of the existing control panel and connected to the card-side terminal receptacles in the relay frame.

CITATION LIST

Patent Document

PTD 1: Japanese Patent Laying-Open No. 2008-289280

SUMMARY OF INVENTION

Technical Problem

According to the replacement method described in PTD 1 above, the relay frame is preliminarily prepared prior to a replacement period for replacing the control panel, and thus, during the replacement period, the existing wiring can be switched to the newly-provided control panel only by the task of connecting the card-side terminal block.

However, in the above-described replacement method, it is necessary to place the dedicated relay frame mounted on the existing control panel at the time of replacing. Since the relay frame has almost the same size as that of the existing control panel, it is necessary to newly secure a space for placing the relay frame in an existing plant. Thus, there is room for improvement in terms of performing the replacement task efficiently. This is not particularly studied in PTD 1 described above.

The present invention has been made to solve the above-described problem, and an object of the present invention is to achieve an increase in efficiency of the task of replacing a control panel.

Solution to Problem

According to an aspect of the present invention, a control panel for monitoring and controlling a control target device external to the control panel, includes: a control apparatus having a controller, and an input/output unit to input/output a plurality of signals to/from the controller; a plurality of signal lines connected to the input/output unit and each to transmit a corresponding one of the plurality of signals; a first terminal block to which a plurality of external wirings connecting to the control target device are electrically connected; a second terminal block to interface between the first terminal block and the plurality of signal lines; and a housing to accommodate the control apparatus, the plurality of signal lines, and the first and second terminal blocks. The second terminal block includes: a plurality of first terminals provided on the first terminal block side and each having a corresponding one of the plurality of external wirings electrically connected thereto; a plurality of second terminals provided on the control apparatus side and each electrically connected to a corresponding one of the plurality of signal lines; and a switching circuit to change a combination of one of the plurality of first terminals and one of the plurality of second terminals connected in a one-to-one relation.

According to another aspect of the present invention, there is provided a method of replacing a control panel for monitoring and controlling a control target device external to the control panel, and the control panel includes: a control apparatus having a controller, and an input/output unit to input/output a plurality of signals to/from the controller; a plurality of signal lines connected to the input/output unit and each to transmit a corresponding one of the plurality of signals; a first terminal block to which a plurality of external wirings connecting to the control target device are electrically and mechanically connected; a second terminal block to interface between the first terminal block and the plurality of signal lines; and a housing to accommodate the control apparatus, the plurality of signal lines, and the first and second terminal blocks. The second terminal block includes: a plurality of first terminals provided on the first terminal block side and each having a corresponding one of the plurality of external wirings electrically and mechanically connected thereto; a plurality of second terminals provided on the control apparatus side and each electrically and mechanically connected to a corresponding one of the plurality of signal lines; and a switching circuit to change a combination of one of the plurality of first terminals and one of the plurality of second terminals connected in a one-to-one relation. The method includes: removing the control apparatus from the housing of the control panel; placing a new control apparatus in the housing of the control panel from which the control apparatus has been removed; adjusting the combination of one of the plurality of first terminals and one of the plurality of second terminals using the switching circuit in the second terminal block, based on specifications of input and output signals in the new control apparatus; and electrically and mechanically connecting the new control apparatus to the second terminal block.

Advantageous Effects of Invention

According to the present invention, an increase in efficiency of the task of replacing a control panel can be achieved.

DESCRIPTION OF EMBODIMENTS

Embodiments of the present invention will be described in detail hereinafter with reference to the drawings, in which the same or corresponding portions are denoted by the same reference characters and description thereof will not be repeated.

First Embodiment (Overall Configuration of Control System)

Figure 1:
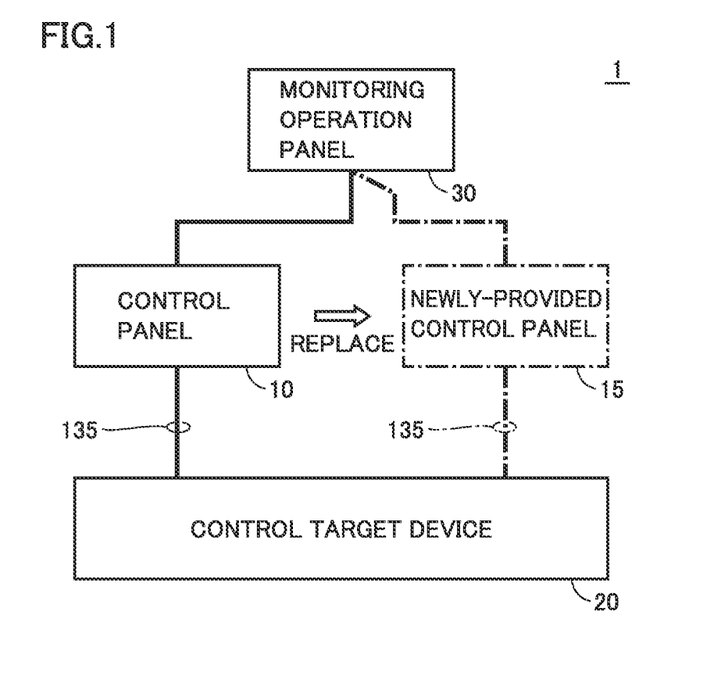
FIG. 1 is a diagram for illustrating a schematic configuration of a general control system.

FIG. 1 is a diagram for illustrating a schematic configuration of a general control system. The control system shown in FIG. 1 is, for example, a control system for monitoring and controlling a plant such as a power plant and a substation.

Referring to FIG. 1, a control system 1 is configured by a control target device 20, a control panel 10 and a monitoring operation panel 30. Control system 1 is, for example, a distributed control system in which a large number of control target devices are divided into a plurality of groups and one control panel 10 is arranged for each group.

Control target device 20 includes, for example, a robot, an actuator, a sensor, a display monitor, an input button and the like provided in the equipment that forms the plant. Control panel 10 controls control target device 20. A plurality of external wirings 135 are laid between control panel 10 and control target device 20. External wirings 135 are connected to a terminal block (not shown) provided in control panel 10. Control panel 10 is electrically connected to control target device 20 through external wirings 135. Control panel 10 transmits a control signal to control target device 20 via external wirings 135. Furthermore, control panel 10 receives various signals output from control target device 20 via external wirings 135.

Monitoring operation panel 30 controls control panel 10. Monitoring operation panel 30 is configured to exchange various types of information and signals with control panel 10 and thereby remotely control target device 20 from outside the plant. Connection between monitoring operation panel 30 and control panel 10 may be wired connection or wireless connection.

In such control system 1, as shown in FIG. 1, already-existing control panel (hereinafter referred to as "existing control panel") 10 may be replaced with a new control panel (hereinafter referred to as "newly-provided control panel") 15. The conventional task of replacing the control panel is performed in accordance with the following procedure.

First, external wirings 135 are disconnected from the terminal block of existing control panel 10 and existing control panel 10 is removed. Next, external wirings 135 are connected to a terminal block of newly-provided control panel 15. Then, a trial run of newly-provided control panel 15 is conducted to perform wiring check and the like. If it is confirmed that there is nothing wrong, the replacement task is ended.

Since the above-described task of replacing the control panel is performed with the operation of control target device 20 stopped, the operation of the plant must be inevitably stopped during the replacement task. In order to increase an operation rate of the plant, the task of replacing the control panel is normally performed during a maintenance and inspection period of the control target device.

However, when several tens to several hundreds of external wirings 135 are laid, disconnection and connection of external wirings 135 require great labor. Therefore, the time of the replacement task becomes longer, which may hinder the operation of the plant.

In recent years, various techniques for simplifying the task of replacing the control panel have been under study. As one of these techniques, PTD 1 described above discloses the method of mounting the relay frame to the existing control panel at the time of replacing. However, there is room for improvement in that the space for placing the relay frame having almost the same size as that of the existing control panel is newly required in the plant.

Thus, in a first embodiment, a housing and the terminal block of existing control panel 10 are used at the time of replacing, which eliminates the need to place the relay frame. A configuration of the control panel according to the first embodiment will be described below.

(Configuration of Control Panel)

Figure 2:
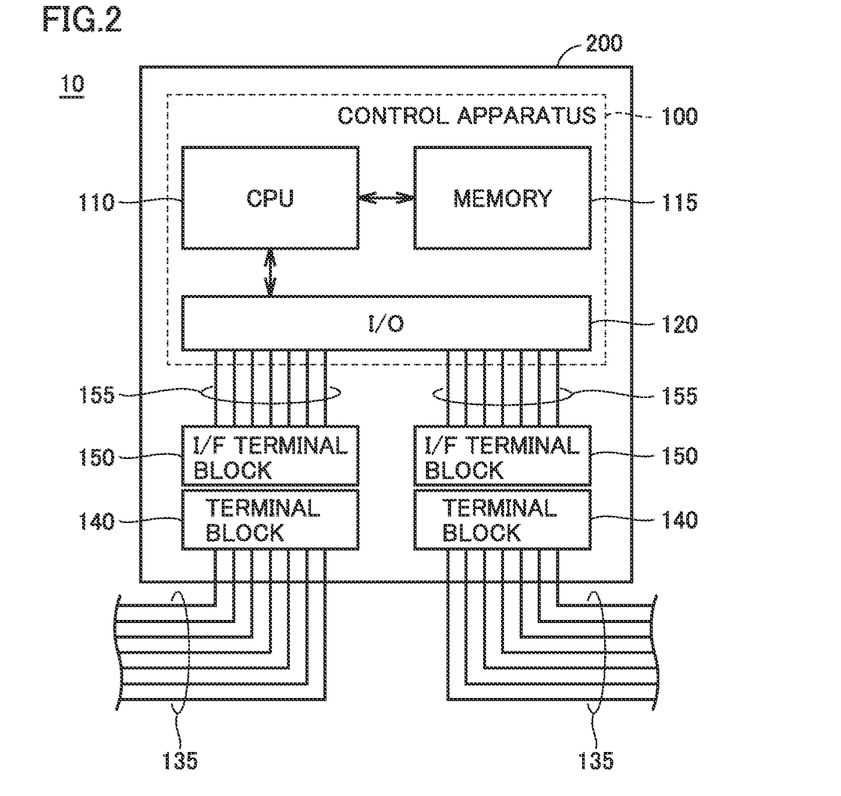
FIG. 2 is a block diagram for illustrating a configuration of a control panel according to a first embodiment.

FIG. 2 is a block diagram for illustrating the configuration of the control panel according to the first embodiment. The control panel shown in FIG. 2 corresponds to existing control panel 10 shown in FIG. 1.

Referring to FIG. 2, control panel 10 includes a control apparatus 100, a terminal block 140, a terminal block for interface (hereinafter also referred to as "I/F terminal block") 150, and a housing 200. Control apparatus 100, terminal block 140 and I/F terminal block 150 are housed in housing 200.

Control apparatus 100 is configured mainly by a microcomputer including a CPU (Central Processing Unit) 110, a memory 115 such as ROM (Read Only Memory) and RAM (Random Access Memory), and an I/O (Input/Output) 120.

The plurality of external wirings 135 connecting to control target device 20 (FIG. 1) are connected to a plurality of terminals 144 (FIGS. 3 and 4) of terminal block 140. Each of the plurality of terminals 144 is configured to input and/or output the signal independently.

I/F terminal block 150 functions as an interface between control apparatus 100 and terminal block 140. One side of I/F terminal block 150 is electrically connected to I/O 120 of control apparatus 100 through a plurality of signal lines 155.

The plurality of signal lines 155 are provided in the same number as the number of external wirings 135 such that the plurality of signal lines 155 have a one-to-one relation with the plurality of external wirings 135. I/O 120 inputs/outputs, to CPU 110, a plurality of signals, each one of which is transmitted to a corresponding one of the plurality of signal lines 155.

Figure 3:
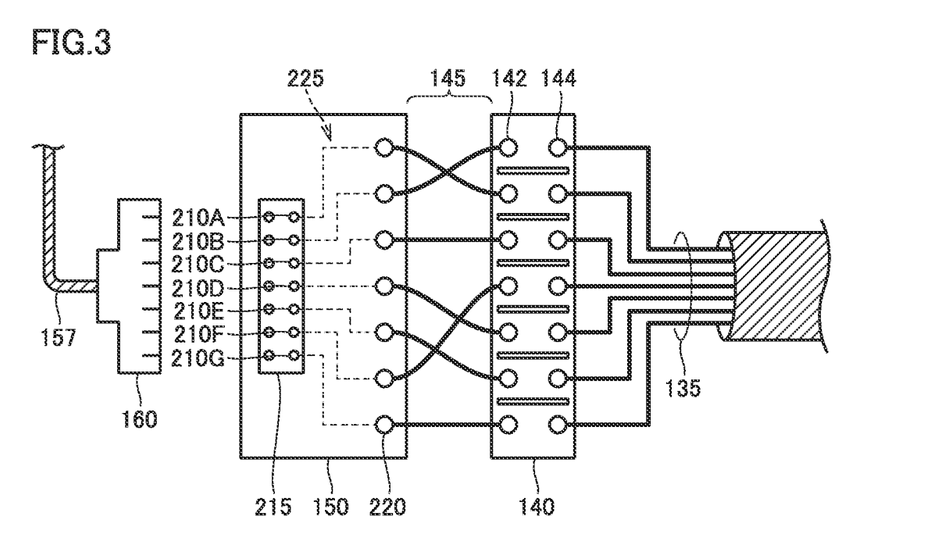
FIG. 3 is a diagram illustrating a comparative example of a method of adjusting wiring connection between a newly-provided control apparatus and an existing terminal block.
Figure 4:
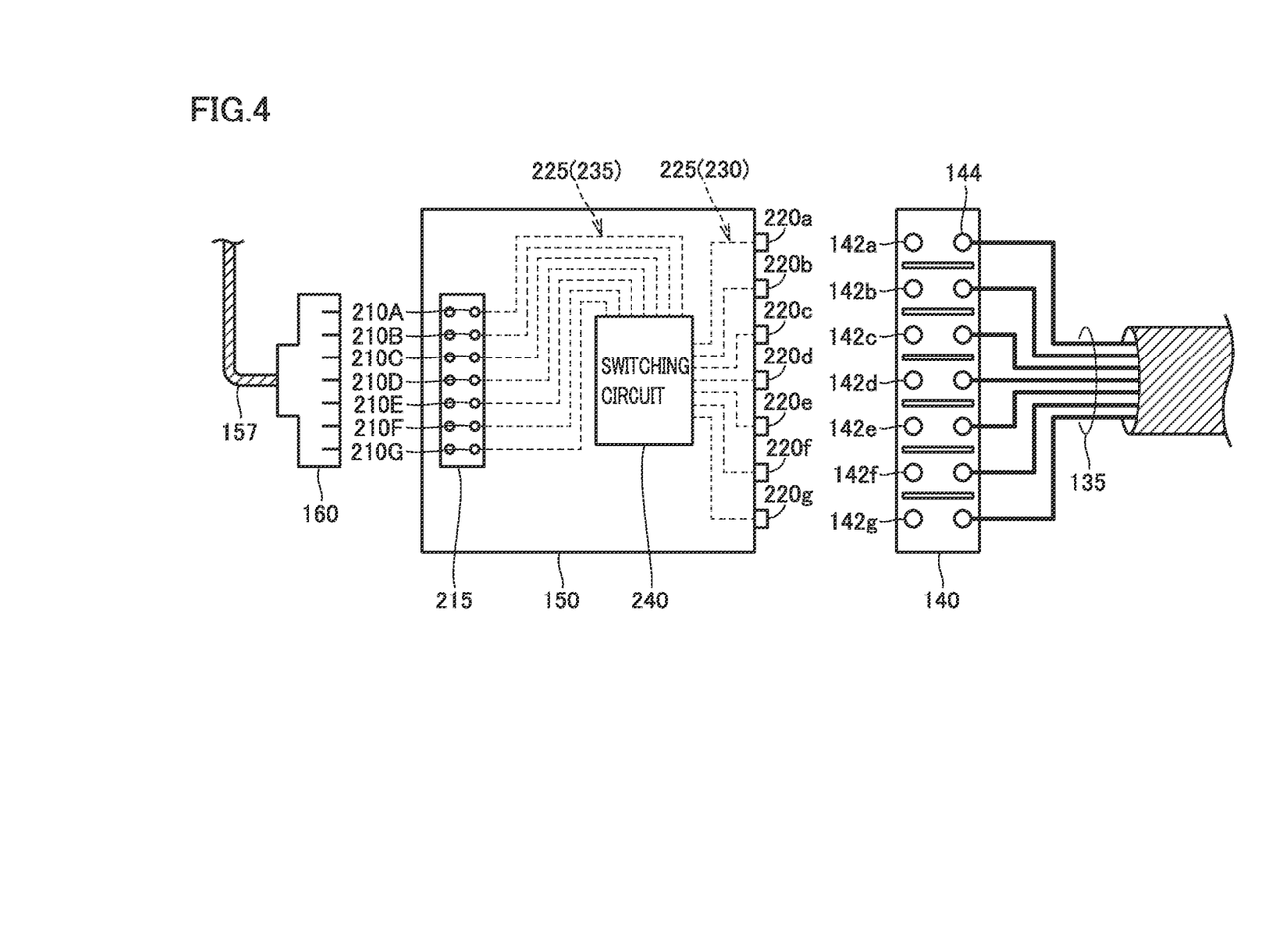
FIG. 4 is a diagram for illustrating a method of adjusting wiring connection between a newly-provided control apparatus and an existing terminal block according to the first embodiment.

As shown in FIGS. 3 and 4, the plurality of signal lines 155 are, for example, bundled into one cable 157. A parallel connector 160 is connected to an end of this cable 157.

A cable connection unit 215 is provided on the control apparatus 100 side of I/F terminal block 150. Cable connection unit 215 includes a plurality of terminals 210A to 210G (second terminals). Each of the plurality of terminals 210A to 210G is configured to input and/or output the signal independently. When parallel connector 160 is connected to cable connection unit 215 of I/F terminal block 150, each one of the plurality of signal lines 155 in cable 155 is electrically connected to a corresponding one of the plurality of terminals 210A to 210G. As a result, each one of signal lines 155 can be independently connected to a corresponding one of the plurality of terminals 210A to 210G.

The other side of I/F terminal block 150 is electrically connected to terminal block 140, i.e., the plurality of external wirings 135. As shown in FIGS. 3 and 4, a plurality of terminals 220 (220a to 220g; first terminals) are provided on the terminal block 140 side of I/F terminal block 150. Each of the plurality of terminals 220a to 220g is configured to input and/or output the signal independently. Furthermore, each one of the plurality of terminals 220a to 220g is electrically connected to a corresponding one of the plurality of terminals 210A to 210G through a plurality of internal wirings 225.

The plurality of terminals 220a to 220g are arranged to face, in a one-to-one relation, a plurality of terminals 142a to 142g provided in terminal block 140. Electrical connection between I/F terminal block 150 and terminal block 140 can be achieved by coupling I/F terminal block 150 to terminal block 140 and thereby bringing the plurality of terminals 220a to 220g into mutual contact with the plurality of terminals 142a to 142g.

In the first embodiment, existing control apparatus 100 is removed from housing 200 of existing control panel 10 and a new control apparatus (hereinafter referred to as "newly-provided control apparatus") is placed in housing 200, whereby the control panel is replaced. In other words, replacement of the control panel according to the first embodiment is performed by using housing 200 and terminal block 140 of existing control panel 10 and replacing existing control apparatus 100 with the newly-provided control apparatus. As a result, the steps of disconnecting and connecting the external wirings, which have been performed in the conventional replacement task, can be eliminated. In addition, the relay described in PTD 1 above can become unnecessary.

On the other hand, the specifications of the input and output signals in the newly-provided control apparatus may be different in some cases from the specifications of the input and output signals in existing control apparatus 100. The specifications of the input and output signals represent the arrangement of the plurality of signal lines 155 in I/O 120 of control apparatus 100. In other words, the difference between the existing control apparatus and the newly-provided control apparatus in terms of the specifications of the input and output signals means that the existing control apparatus is different from the newly-provided control apparatus in terms of the arrangement of the plurality of signal lines 155.

In such a case, the plurality of signal lines 155 electrically connected to the plurality of terminals 210A to 210G of I/F terminal block 150 are arranged in accordance with the specifications of the input and output signals in the newly-provided control apparatus. On the other hand, the plurality of external wirings 135 electrically connected to the plurality of terminals 142a to 142g of existing terminal block 140 are arranged in accordance with the specifications of the input and output signals in the existing control apparatus. Therefore, it is necessary to change the specifications of the input and output signals in existing terminal block 140 to adapt to the specifications of the input and output signals in the newly-provided control apparatus.

In the first embodiment, existing terminal block 140 is used as it is, without changing the specifications of the input and output signals in existing terminal block 140. Therefore, wiring connection for electrically connecting the newly-provided control apparatus and existing terminal block 140 is adjusted such that the arrangement of the plurality of signal lines 155 matches the arrangement of the plurality of external wirings 135.

As a method of adjusting wiring connection between the newly-provided control apparatus and existing terminal block 140, a configuration of achieving connection between existing terminal block 140 and I/F terminal block 150 by a plurality of inter-terminal wirings 145 as shown in FIG. 3 is employed, for example. In this configuration, it is possible to adopt a method of laying the plurality of inter-terminal wirings 145 such that the plurality of signal lines 155 match the plurality of external wirings 135 in accordance with the specifications of the input and output signals in the newly-provided control apparatus.

However, according to the method shown in FIG. 3, when the number of external wirings 135 and signal lines 155 increases, the number of inter-terminal wirings 145 increases accordingly. Therefore, the task of laying inter-terminal wirings 145 becomes complicated, which may hamper an increase in efficiency of the replacement task.

Thus, in the first embodiment, a switching circuit 240 is provided in I/F terminal block 150 as shown in FIG. 4. Switching circuit 240 is configured to freely change a combination of one of the plurality of terminals 220a to 220g and one of the plurality of terminals 210A to 210G connected in a one-to-one relation.

Specifically, a plurality of first internal wirings 230 and a plurality of second internal wirings 235 are provided in I/F terminal block 150. Each one of the plurality of first internal wirings 230 is connected to a corresponding one of the plurality of terminals 220a to 220g. Each one of the plurality of second internal wirings 235 is connected to a corresponding one of the plurality of terminals 210A to 210G. Switching circuit 240 electrically connects the plurality of first internal wirings 230 and the plurality of second internal wirings 235 in a one-to-one relation. A combination of first internal wiring 230 and second internal wiring 235 connected in a one-to-one relation is set in accordance with the specifications of the input and output signals in the newly-provided control apparatus.

Figure 5:
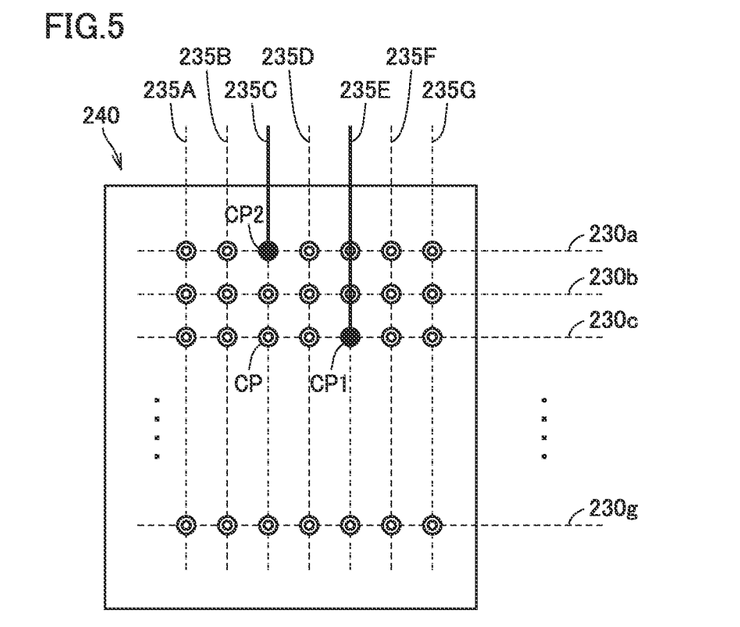
FIG. 5 is a diagram illustrating a basic configuration of a switching circuit shown in FIG. 4.

FIG. 5 is a diagram illustrating a basic configuration of switching circuit 240 shown in FIG. 4. A basic concept of changing connection between first internal wiring 230 and second internal wiring 235 in switching circuit 240 will be described with reference to FIG. 5.

Referring to FIG. 5, inside switching circuit 240, the plurality of first internal wirings 230a to 230g extend in parallel to one another along a first direction (e.g., a horizontal direction on the sheet). The plurality of second internal wirings 235A to 235G extend in parallel to one another along a second direction (e.g., a vertical direction on the sheet) different from the first direction. The plurality of first internal wirings 230a to 230g and the plurality of second internal wirings 235A to 235G are arranged to intersect with one another in a plan view of switching circuit 240, while keeping electrical insulation.

By arranging the plurality of first internal wirings 230a to 230g and the plurality of second internal wirings 235A to 235G in a grade separated crossing manner, a plurality of intersection points CP are formed. The plurality of intersection points CP are arranged in a matrix shape in a plan view of switching circuit 240 as shown in FIG. 5.

Switching circuit 240 includes a connecting unit for selectively electrically activating the plurality of intersection points CP. When intersection point CP is electrically activated, first internal wiring 230 and second internal wiring 235 intersecting with each other at this intersection point CP are electrically connected. A configuration of the connecting unit will be described below.

In the example of FIG. 5, nine intersection points CP are formed on first internal wiring 230c with respect to the plurality of second internal wirings 235A to 235G. Using the connecting unit, switching circuit 240 electrically activates only one intersection point CP of these nine intersection points CP. For example, when an intersection point CP1 shown in the figure is electrically activated, first internal wiring 230c and second internal wiring 235E are electrically connected. Similarly, when an intersection point CP2 shown in the figure is electrically activated, first internal wiring 230a and second internal wiring 235C are electrically connected. Based on the specifications of the input and output signals in the newly-provided control apparatus, it is determined which of nine intersection points CP is electrically activated.

As described above, switching circuit 240 electrically activates a part of the plurality of intersection points CP arranged in a matrix shape. The electrically activated part of intersection points CP is selected such that first internal wiring 230 matches second internal wiring 235, based on the specifications of the input and output signals in the newly-provided control apparatus. In this manner, in switching circuit 240, the electrical connection between first internal wiring 230 and second internal wiring 235 is adjusted in accordance with the specifications of the input and output signals in the newly-provided control apparatus. Therefore, when taking I/F terminal block 150 as a whole, the plurality of terminals 220a to 220g and the plurality of terminals 210A to 210G are connected in a one-to-one relation in such a manner that the arrangement of the plurality of terminals 220a to 220g substantially matches the arrangement of the plurality of terminals 210A to 210G.

(Task of Replacing Control Panel)

Figure 6:
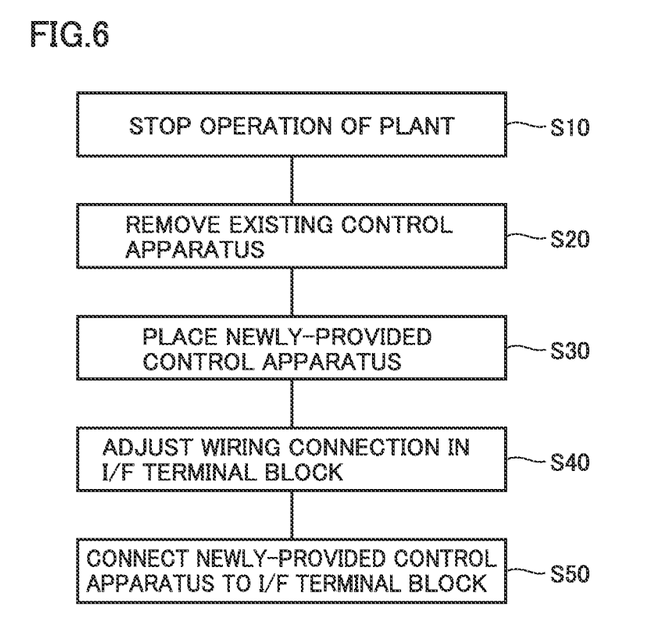
FIG. 6 is a flowchart for illustrating a method of replacing the control panel according to the first embodiment.

FIG. 6 is a flowchart for illustrating a method of replacing the control panel according to the first embodiment. The method of replacing the control panel according to the first embodiment mainly includes: removing existing control apparatus 100 from housing 200 of existing control panel 10 (S20); placing a new control apparatus in housing 200 of existing control panel 10 (S30); adjusting a combination of terminal 220 and terminal 210 electrically connected in a one-to-one relation in I/F terminal block 150 (S40); and connecting the newly-provided control apparatus to I/F terminal block 150 subjected to wiring adjustment (S50).

Specifically, referring to FIG. 6, the operation of the plant is first stopped (step S10). After the operation of the plant is stopped, existing control panel 10 is powered off.

Next, existing control apparatus 100 is removed from powered-off existing control panel 10 (step S20). As a result, I/F terminal block 150 and existing terminal block 140 are left in existing control panel 10.

Next, a new control apparatus is placed in existing control panel 10 having terminal block 140 and I/F terminal block 150 left therein (step S30).

Next, wiring connection between existing terminal block 140 and the newly-provided control apparatus is adjusted using switching circuit 240 in I/F terminal block 150 (step S40). Inside switching circuit 240, the electrical connection between first internal wiring 230 and second internal wiring 235 is adjusted in accordance with the specifications of the input and output signals in the newly-provided control apparatus. As a result, the arrangement of the plurality of terminals 220a to 220g is matched with the arrangement of the plurality of terminals 210A to 210G.

Next, parallel connector 160 of cable 157 connecting to the newly-provided control apparatus is connected to cable connection unit 215 of I/F terminal block 150 subjected to wiring connection adjustment (step S50). As a result, each one of the plurality of signal lines 155 is electrically connected to a corresponding one of the plurality of terminals 210A to 210G. In other words, each one of signal lines 155 is independently electrically connected to a corresponding one of the plurality of terminals 210A to 210G. As a result, with I/F terminal block 150 and existing terminal block 140 interposed therebetween, the plurality of signal lines 155 and the plurality of external wirings 135 are electrically connected in such a manner that the arrangement of the plurality of signal lines 155 matches the arrangement of the plurality of external wirings 135.

When wiring to the newly-provided control apparatus is completed as described above, the task of replacing the control panel ends. After the end of the task of replacing the control panel, existing control panel 10 is powered on again, and thus, the operation of the plant can be restarted.

As described above, the task of replacing the control panel according to the first embodiment is performed by using housing 200 and terminal block 140 of existing control panel 10 and replacing existing control apparatus 100 with the newly-provided control apparatus. As a result, the steps of disconnecting and connecting the external wirings, which have been performed in the conventional replacement task, can be eliminated. In addition, the relay can become unnecessary.

In addition, even when the newly-provided control apparatus is different from the existing control apparatus in terms of the specifications of the input and output signals, the plurality of signal lines 155 connecting to the newly-provided control apparatus can be matched with the plurality of external wirings 135 connected to existing terminal block 140, by using switching circuit 240 provided in terminal block 150 serving as an interface between the newly-provided control apparatus and the existing terminal block. As a result, existing terminal block 140 can be used as it is, without changing the specifications of the input and output signals in existing terminal block 140.

Furthermore, since the steps of disconnecting and connecting the wirings for the purpose of replacing control apparatus 100 are eliminated, a trial run of the control panel for wiring check becomes unnecessary.

As a result, according to the control panel and the method of replacing the control panel according to the first embodiment, an increase in efficiency of the task of replacing the control panel can be achieved.

(Specific Configuration Example of Switching Circuit)

A specific configuration example of switching circuit 240 described with reference to FIG. 5 will be described in second and third embodiments below.

Second Embodiment

Figure 7:
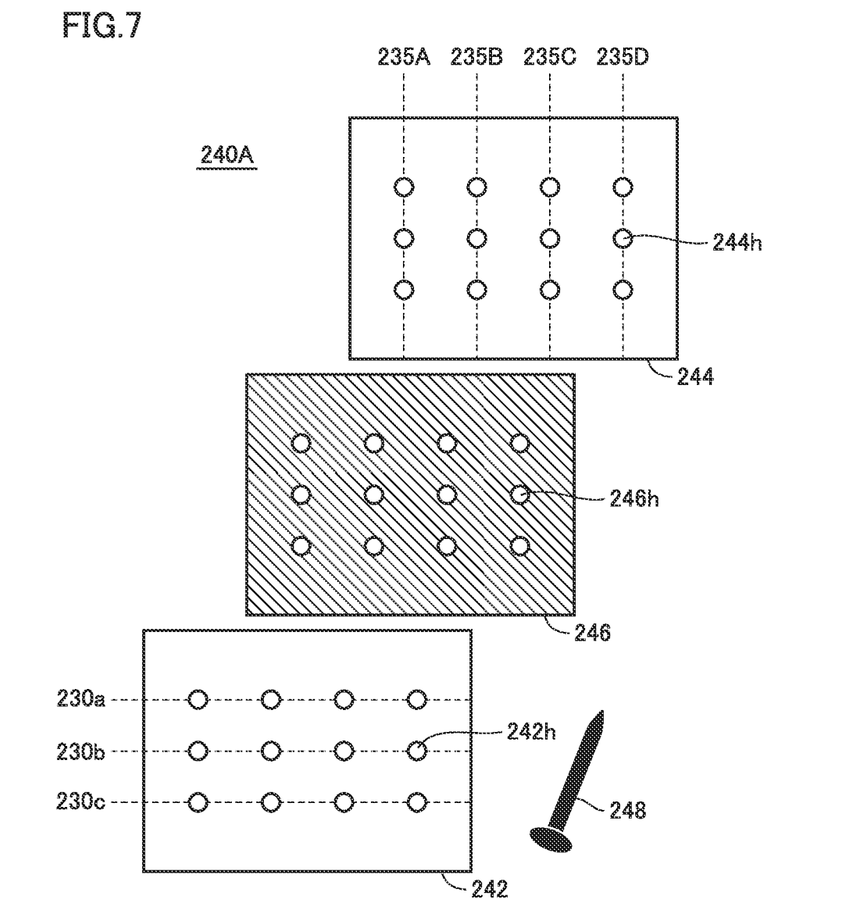
FIG. 7 is a schematic configuration diagram of a switching circuit placed in an I/F terminal block in a control panel according to a second embodiment.

FIG. 7 is a schematic configuration diagram of a switching circuit placed in an I/F terminal block in a control panel according to the second embodiment. Since a configuration of the control panel according to the second embodiment is similar to that shown in FIG. 2, detailed description will not be repeated. In addition, since a configuration of I/F terminal block 150 is also similar to that shown in FIG. 4 except for the configuration of switching circuit 240, detailed description will not be repeated.

Referring to FIG. 7, a switching circuit 240A includes a first substrate 242, a second substrate 244 and an insulating substrate 246. First substrate 242 has the plurality of first internal wirings 230 formed on a surface thereof. The plurality of first internal wirings 230 extend in parallel to one another along a first direction (e.g., a horizontal direction on the sheet).

Second substrate 244 is arranged on the surface of first substrate 242. Second substrate 244 has the plurality of second internal wirings 235 formed on a surface opposite to a surface facing first substrate 242. The plurality of second internal wirings 235 extend in parallel to one another along a second direction (e.g., a vertical direction on the sheet).

Insulating substrate 246 is arranged between first substrate 242 and second substrate 244. First substrate 242 and second substrate 244 are stacked with insulating substrate 246 interposed therebetween. Insulating substrate 246 serves to keep electrical insulation between first internal wirings 230 and second internal wirings 235.

Although not shown in the figure, in the above-described three-layer substrates, the plurality of first internal wirings 230 and the plurality of second internal wirings 235 are arranged in a grade separated crossing manner. A plurality of openings 242h, 244h and 246h penetrating in a substrate thickness direction are formed in each of first substrate 242, second substrate 244 and insulating substrate 246. Each of openings 242h, 244h and 246h is arranged at a position of a corresponding one of the plurality of intersection points CP (refer to FIG. 5).

Figure 8:
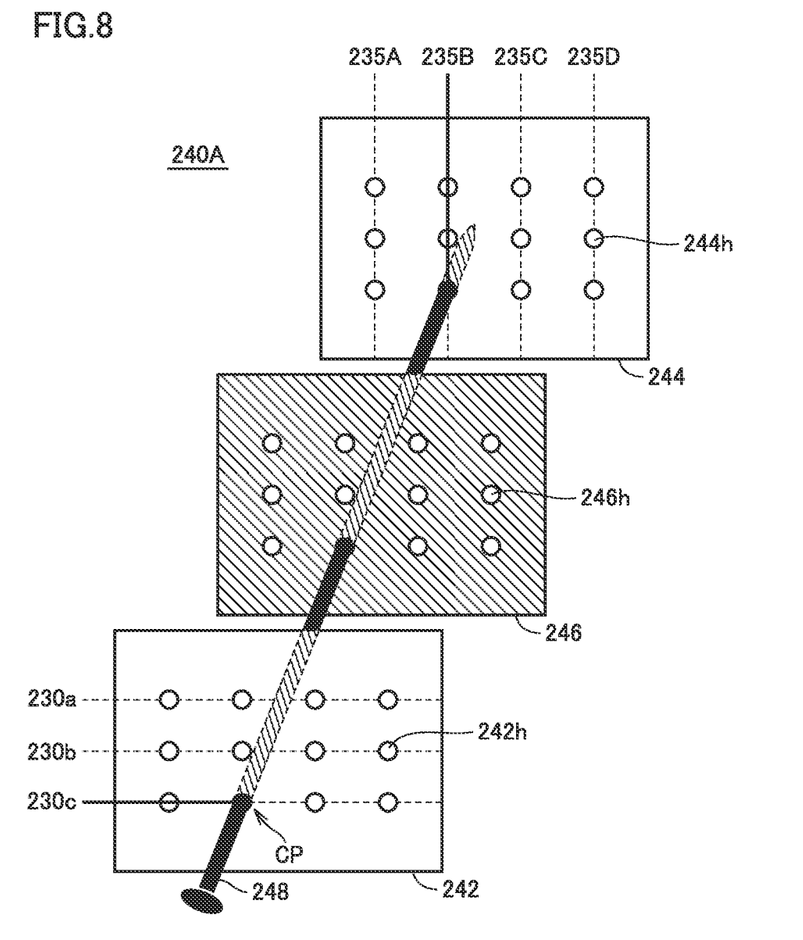
FIG. 8 is a schematic configuration diagram of the switching circuit placed in the I/F terminal block in the control panel according to the second embodiment.

Using a connecting unit 248, switching circuit 240A electrically connects first internal wiring 230 and second internal wiring 235 intersecting with each other at prescribed intersection point CP. As shown in FIG. 8, connecting unit 248 is configured to electrically connect corresponding first and second internal wirings 230 and 235, with connecting unit 248 inserted into openings 242h, 244h and 246h. As connecting unit 248, a needle-like electrode member that can be inserted into the openings can be used, for example.

FIG. 8 schematically shows the state in which connecting unit (electrode member) 248 has been inserted into openings 242h, 244h and 246h. In the example of FIG. 8, connecting unit 248 is inserted into openings 242h, 244h and 246h arranged at intersection point CP of first internal wiring 230c and second internal wiring 235B. As a result, first internal wiring 230c and second internal wiring 235B are electrically connected by connecting unit 248.

As described above, connecting unit (electrode member) 248 is inserted into openings 242h, 244h and 246h provided at each of a part of intersection points CP selected in accordance with the specifications of the input and output signals in the newly-provided control apparatus. The connection between first internal wiring 230 and second internal wiring 235 is adjusted using connecting unit 248, whereby the arrangement of the plurality of terminals 220a to 220g is matched with the arrangement of the plurality of terminals 210A to 210G.

Third Embodiment

Figure 9:
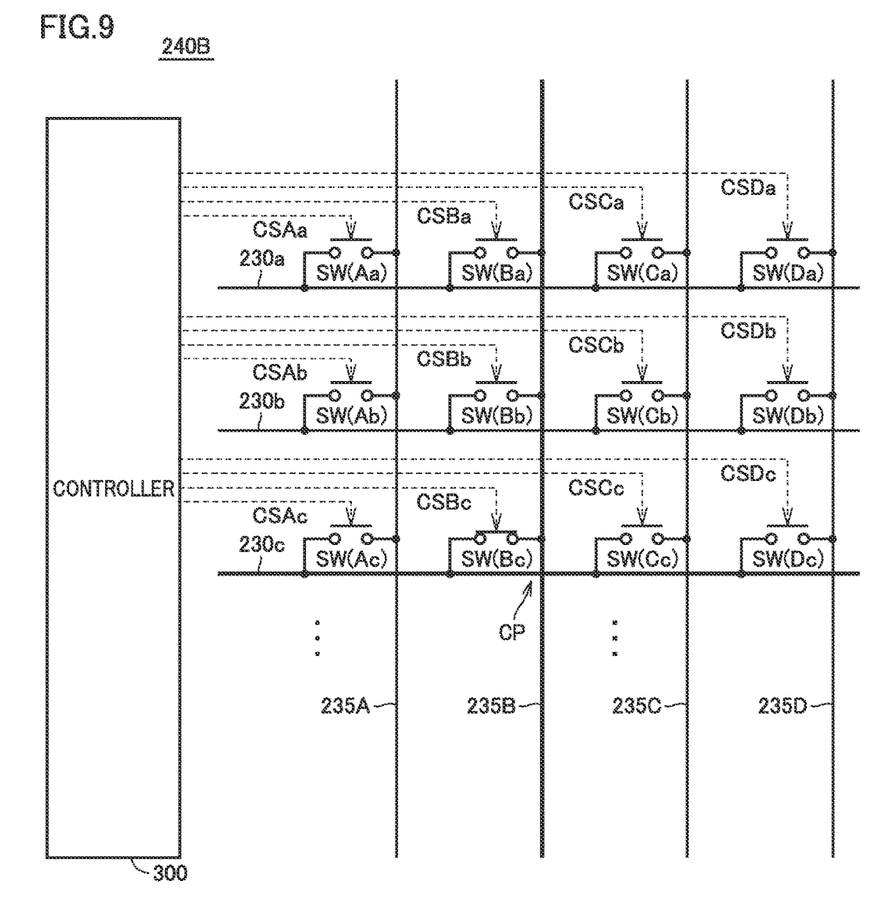
FIG. 9 is a schematic configuration diagram of a switching circuit placed in an I/F terminal block in a control panel according to a third embodiment.

FIG. 9 is a schematic configuration diagram of a switching circuit placed in an I/F terminal block in a control panel according to the third embodiment. Since a configuration of the control panel according to the third embodiment is similar to that shown in FIG. 2, detailed description will not be repeated. In addition, since a configuration of I/F terminal block 150 is also similar to that shown in FIG. 5 except for the configuration of switching circuit 240, detailed description will not be repeated.

Referring to FIG. 9, a switching circuit 240B includes a plurality of switches SW and a controller 300. Each one of the plurality of switches SW is arranged at a corresponding one of the plurality of intersection points CP formed between the plurality of first internal wirings 230 and the plurality of second internal wirings 235.

Each of the plurality of switches SW is connected between corresponding first and second internal wirings 230 and 235. Conduction (ON) and interruption (OFF) of each switch SW are controlled in response to a control signal CS provided from controller 300. When switch SW is turned on, corresponding first and second internal wirings 230 and 235 are electrically connected.

Various types of power semiconductor switching elements are, for example, used as switch SW. Controller 300 is implemented using hardware such as, for example, FPGA (Field-Programmable Gate Array). Alternatively, all or a part of controller 300 may be implemented by causing a processor to execute a program.

In the example of FIG. 9, a switch SW(Ba) is connected between first internal wiring 230a and second internal wiring 235B, a switch SW(Bb) is connected between first internal wiring 230b and second internal wiring 235B, and a switch SW(Bc) is connected between first internal wiring 230c and second internal wiring 235B. ON and OFF of switch SW(Ba) are controlled in response to a control signal CSBa provided from controller 300, ON and OFF of switch SW(Bb) are controlled in response to a control signal CSBb, and ON and OFF of switch SW(Bc) are controlled in response to a control signal CSBc. For example, when switch SW(Bc) is turned on in response to control signal CSBc, first internal wiring 230c and second internal wiring 235B are electrically connected.

Controller 300 selectively turns on switch SW arranged at prescribed intersection point CP, of the plurality of switches SW, and thereby electrically connects first internal wiring 230 and second internal wiring 235 intersecting with each other at this intersection point CP. The information about switch SW that is selectively turned on can be preset in accordance with the specifications of the input and output signals in the newly-provided control apparatus and stored in controller 300.

As described above, switching circuit 240B adjusts the electrical connection between first internal wiring 230 and second internal wiring 235 through ON/OFF control of the plurality of switches SW by controller 300. As a result, the arrangement of the plurality of terminals 220a to 220g is matched with the arrangement of the plurality of terminals 210A to 210G.

The control panels according to the first to third embodiments described above have such a configuration that the electrical connection between I/F terminal block 150 and terminal block 140 is achieved by coupling I/F terminal block 150 to terminal block 140 and bringing the plurality of terminals 220a to 220g into mutual contact with the plurality of terminals 142a to 142g. In such a configuration, it is preferable to prepare a plurality of types of I/F terminal blocks 150 having different sizes, so as to adapt to the type of the size of terminal block 140 (particularly, the width in the direction of arrangement of the plurality of terminals 142a to 142g). As a result, an interface between terminal block 140 and control apparatus 100 can be achieved for terminal blocks 140 having various sizes.

In the first to third embodiments described above, terminal block 140 corresponds to one example of "first terminal block", and I/F terminal block 150 corresponds to one example of "second terminal block". Furthermore, the plurality of terminals 220 correspond to one example of "first terminals", the plurality of terminals 220 correspond to one example of "second terminals", and switching circuit 240 corresponds to one example of "switching circuit".

It should be understood that the embodiments disclosed herein are illustrative and not limitative in any respect. The scope of the present invention is defined by the terms of the claims, rather than the description above, and is intended to include any modifications within the scope and meaning equivalent to the terms of the claims.

REFERENCE SIGNS LIST 1 control system; 10 control panel (existing control panel); 15 newly-provided control panel; 20 control target device; 30 monitoring operation panel; 100 control apparatus; 110 CPU; 115 memory; 120 I/O; 140 terminal block; 142, 142a to 142g, 144, 210, 210A to 210G, 220, 220a to 220g terminal; 135 external wiring; 150 I/F terminal block; 155 signal line; 157 cable; 160 parallel connector; 215 cable connection unit; 230 first internal wiring; 235 second internal wiring; 240, 240A, 240B switching circuit; 242 first substrate; 244 second substrate; 246 insulating substrate; 242h, 244h, 246h opening; 248 connecting unit; 300 controller; CP intersection point; SW switch.

The invention claimed is:

1. A control panel for monitoring and controlling a control target device external to the control panel, comprising:
a control apparatus having a controller to monitor and control the control target device, and an input/output unit to input/output a plurality of signals to/from the controller;
a plurality of signal lines connected to the input/output unit and each to transmit a corresponding one of the plurality of signals;
a first terminal block to which a plurality of external wirings connecting to the control target device are electrically connected;
a second terminal block to interface between the first terminal block and the plurality of signal lines; and
a housing to accommodate the control apparatus, the plurality of signal lines, and the first and second terminal blocks,
the second terminal block including:
a plurality of first terminals provided on the first terminal block side and each having a corresponding one of the plurality of external wirings electrically connected thereto;
a plurality of first internal wirings each connected to a corresponding one of the plurality of first terminals, and extending in parallel to one another;
a plurality of second terminals provided on the control apparatus side and each electrically connected to a corresponding one of the plurality of signal lines;
a plurality of second internal wirings each connected to a corresponding one of the plurality of second terminals, and extending in parallel to one another; and
a switching circuit to change a combination of one of the plurality of first terminals and one of the plurality of second terminals connected in a one-to-one relation,
the plurality of first internal wirings and the plurality of second internal wirings being arranged to intersect with one another in a plan view of the switching circuit, while keeping electrical insulation,
at each of a plurality of intersection points formed by the plurality of first internal wirings and the plurality of second internal wirings intersecting with one another, the switching circuit including a connecting unit to switch between electrical connection and disconnection between the corresponding first and second internal wirings.

2. The control panel according to claim 1, wherein the switching circuit further includes:
a first substrate having the plurality of first internal wirings formed on a surface thereof;
a second substrate arranged on the surface of the first substrate and having the plurality of second internal wirings formed on a surface opposite to a surface facing the first substrate; and
an insulating substrate arranged between the first substrate and the second substrate,
at each of the plurality of intersection points, an opening penetrating in a substrate thickness direction is formed in the first substrate, the second substrate and the insulating substrate, and
the connecting unit is configured by an electrode member to electrically connect the corresponding first and second internal wirings, with the electrode member inserted into the opening.

3. The control panel according to claim 1, wherein the connecting unit is configured by a plurality of switches each arranged at a corresponding one of the plurality of intersection points and each connected between the corresponding first and second internal wirings, and
the switching circuit further includes a controller to control conduction and interruption of the plurality of switches.

4. A method of replacing a control panel for monitoring and controlling a control target device external to the control panel, the control panel including:
a control apparatus having a controller to monitor and control the control target device, and an input/output unit to input/output a plurality of signals to/from the controller;
a plurality of signal lines connected to the input/output unit and each to transmit a corresponding one of the plurality of signals;
a first terminal block to which a plurality of external wirings connecting to the control target device are electrically and mechanically connected;
a second terminal block to interface between the first terminal block and the plurality of signal lines; and
a housing to accommodate the control apparatus, the plurality of signal lines, and the first and second terminal blocks,
the second terminal block including:
  a plurality of first terminals provided on the first terminal block side and each having a corresponding one of the plurality of external wirings electrically and mechanically connected thereto;
  a plurality of first internal wirings each connected to a corresponding one of the plurality of first terminals, and extending in parallel to one another;
  a plurality of second terminals provided on the control apparatus side and each electrically and mechanically connected to a corresponding one of the plurality of signal lines;
  a plurality of second internal wirings each connected to a corresponding one of the plurality of second terminals, and extending in parallel to one another; and
  a switching circuit to change a combination of one of the plurality of first terminals and one of the plurality of second terminals connected in a one-to-one relation,
the plurality of first internal wirings and the plurality of second internal wirings being arranged to intersect with one another in a plan view of the switching circuit, while keeping electrical insulation,
at each of a plurality of intersection points formed by the plurality of first internal wirings and the plurality of second internal wirings intersecting with one another, the switching circuit including a connecting unit to switch between electrical connection and disconnection between the corresponding first and second internal wirings,
the method comprising:
removing the control apparatus from the housing of the control panel;
placing a new control apparatus in the housing of the control panel from which the control apparatus has been removed;
adjusting the combination of one of the plurality of first terminals and one of the plurality of second terminals using the switching circuit in the second terminal block, based on specifications of input and output signals in the new control apparatus; and
electrically and mechanically connecting the new control apparatus to the second terminal block.

* * * * *